(12) United States Patent
van Veldhoven (10) Patent No.: US 9,246,465 B2
(45) Date of Patent: Jan. 26, 2016

(54) MIXER

(71) Applicant: NXP B.V., Eindhoven (NL)

(72) Inventor: Robert Hendrikus Margaretha van Veldhoven, Dommelen (NL)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 14/525,758

(22) Filed: Oct. 28, 2014

(65) Prior Publication Data

US 2015/0130536 A1     May 14, 2015

(30) Foreign Application Priority Data

Nov. 8, 2013 (EP) .................................... 13192191

(51) Int. Cl.

| G06G 7/12 | (2006.01) |
|---|---|
| G06F 7/44 | (2006.01) |
| H03H 7/075 | (2006.01) |
| H03D 7/12 | (2006.01) |
| H03D 7/14 | (2006.01) |
| H03F 3/45 | (2006.01) |
| H03F 3/72 | (2006.01) |

(52) U.S. Cl.
CPC ............. *H03H 7/075* (2013.01); *H03D 7/125* (2013.01); *H03D 7/1441* (2013.01); *H03D 7/1466* (2013.01); *H03F 3/45071* (2013.01); *H03F 3/72* (2013.01); *H03D 2200/0074* (2013.01); *H03D 2200/0086* (2013.01); *H03F 2200/333* (2013.01)

(58) Field of Classification Search
CPC ...... H03H 7/075; H03H 3/72; H03H 3/45071
USPC ................... 327/355–361, 308; 455/323, 326
See application file for complete search history.

(56) References Cited

U.S. PATENT DOCUMENTS

| 4,631,694 A | 12/1986 | Single |
| 5,175,623 A * | 12/1992 | Jenison .......................... 348/598 |
| 5,523,721 A * | 6/1996 | Segawa et al. ................... 330/86 |
| 6,262,626 B1 | 7/2001 | Bakker et al. |
| 7,162,029 B2 * | 1/2007 | Soman et al. ............. 379/399.02 |
| 8,138,817 B2 | 3/2012 | Brekelmans et al. |
| 2005/0059376 A1 | 3/2005 | Davis |
| 2012/0322398 A1 | 12/2012 | Pullela et al. |

FOREIGN PATENT DOCUMENTS

| FR | 2 864 375 A1 | 6/2005 |
| WO | 2009/057051 A1 | 5/2009 |
| WO | 2010/089700 A1 | 8/2010 |

OTHER PUBLICATIONS

Extended European Search Report for Application No. 13192191.8 (Apr. 9, 2014).

* cited by examiner

*Primary Examiner* — Dinh Le (57) ABSTRACT

A mixer comprising a ladder having at least two resistances arranged in series and an input configured to receive an input signal and apply it across the ladder, said ladder including an output arrangement comprising at least three branches, a first branch branching from a first end of the ladder, a second branch branching from between the at least two resistances and a third branch branching from a second end of the ladder, opposite the first end, each branch including a switch for controlling a connection between its branch and an output.

14 Claims, 5 Drawing Sheets

MIXER

CROSS-REFERENCE TO RELATED APPLICATIONS

This application claims the priority under 35 U.S.C. §119 of European patent application no. 13192191.8, filed on Nov. 8, 2013, the contents of which are incorporated by reference herein.

This invention relates to a mixer structure and a harmonic reject mixer or quadrature mixer. It also relates to a chopping amplifier. Further, the invention relates to an integrated circuit incorporating said mixer.

A mixer can receive an input signal and multiply it by a mixer signal to form an output signal. The structure and performance of a mixer is important to reduce the harmonics that are introduced into the output signal. Thus, a harmonic reject mixer has a structure that rejects some or all of the harmonics that could be included in the output signal and therefore acts to keep harmonics in the output signal low. In particular, it is desired to avoid down mixing of input frequencies at multiples of a local oscillator frequency $f_{LO}$. This is problematic using a known four switch mixer as this device mixes an input signal with a square wave and will therefore not only down convert signals at to but all signals which are at $n*f_{LO}$. A harmonic reject mixer preferably only down converts signals at $f_{LO}$. A chopping amplifier comprises an arrangement of an input mixer, amplifier and an output mixer. The input and output mixers typically comprise four input and four output switches which form an input and output mixer respectively. The input mixer mixes the incoming signal to a chopping frequency (and inherently its harmonics). The input signal will therefore be modulated away from DC, for example, so a DC offset of the amplifier will not distort the input signal. Furthermore, if chosen properly, the input signal will also be modulated beyond a thermal-1/f noise corner of the amplifier, and the input signal will not be distorted with the 1/f noise of the amplifier. At the output of the amplifier, the signal is mixed back to DC, for example, and the amplifier's DC offset and 1/f noise is modulated to the chopping frequency, where it can be filtered away in subsequent stages.

According to a first aspect of the invention we provide a mixer comprising a ladder having at least two resistances arranged in series and an input configured to receive an input signal and apply it across the ladder, said ladder including an output arrangement comprising at least three branches, a first branch branching from a first end of the ladder, a second branch branching from between the at least two resistances and a third branch branching from a second end of the ladder, opposite the first end, each branch including a switch for controlling a connection between its branch and an output.

This arrangement is advantageous as by switching the switches in a particular sequence, the input signal is modulated. In effect, a mixer signal, formed by the switching of the switches is mixed with the input signal to form an output signal. The modulated output signal can be received from the common output where the branches convene.

The ladder may comprise N−1 discrete resistances and the output arrangement comprises N branches wherein a first branch branches from the ladder at the first end, a final branch branches from the ladder at the second end and the other branches branch from positions between adjacent resistors in the ladder. Thus, each "pair" of adjacent resistors has a branch that extends from the ladder between them. This is advantageous as a plurality of resistances can be connected together in series in a chain-link manner. The resistors may be connected, in series, by conductor lines, the branches extending from the conductor lines that extend between adjacent resistances. The ladder may comprise at least three, four, five, six, seven or eight resistances.

The mixer may include a switch controller configured to switch said switches in a switching sequence. The switch controller may be configured to close one of the switches during each of a plurality of successive time periods, while setting the remaining switches to be open. Thus, the switches may be closed in a "one closed" sequence such that one switch in the ladder is closed at any one time. The switching sequence may comprise closing one of the switches each time period moving through the switches as they are arranged in the ladder from the first end of the ladder to the second end. The switching sequence may then proceed in reverse order and may then repeat. The switches located in the branches at the ends of the ladder may be actuated once during a switching sequence, while the switches in the remaining branches may be actuated twice. It will be appreciated that any desired switching sequence is possible.

The resistors in the ladder may be selected such that when switching the switches with a fixed interval between switching (for a given output frequency of the mixer) following the above sequence to connect an associated branch to the output, the resistance between the input and output varies between upper and lower limits such that an output signal varies substantially sinusoidally. Thus, the one closed sequence moving along the ladder from one end to the other can generate an approximate sinusoidal waveform in a step-wise manner.

This is advantageous as the switch controller can be set to use a fixed interval between switch instructions (when operating at a particular mixer or local oscillator frequency) and the resistances are sized such that resistance of the ladder between the input and output causes a signal at the output to vary sinusoidally as the sequence is followed. Thus, a mixer that can approximate a sinusoidal local oscillator signal can be advantageously formed from a plurality of resistors and switches.

The resistance of each resistor $Rt_n$ in the ladder may be determined by;

$$Rt_n = Rt \cdot \sin\left(\frac{\pi}{2(N-1)}\right) \cdot \sin\left(\frac{\pi}{2(N-1)}(2n+1)\right)$$

where n is the nth resistor in the ladder and N is the total number of branches in the output arrangement, and Rt is the total resistance of the ladder.

The resistances in the ladder may be selected such that following the above switching sequence the voltage at the output is given by $\frac{1}{2}V_{in}(1+\sin(\omega_{LO}t))$ where $\omega_{LO}=2\pi*f_{LO}$, $f_{LO}$ comprises the local oscillator frequency, which is the frequency of the waveform created by the switching sequence, $V_{in}$ comprises a DC voltage applied to the input, and t comprises time. The switches are switched with a frequency $f_s$ and thus the ladder produces a sine wave of frequency $f_{LO}$ sampled at frequency $f_s$ which has $f_{LO}/f_s$ sample points. It will be appreciated that frequency components related to $f_s$ have been ignored.

Alternatively, the resistors in the ladder may have the same resistance. An approximated sinusoidal mix signal can still be formed using uniform resistances in the ladder by varying the time interval between switching over a switching sequence such that the time interval varies (in a series of steps) over a set of time intervals related to the number of branches such that the voltage at each branch is presented to the output at the appropriate time to generate a sinusoidally varying output. In general, the time between selecting which one of the switches in the ladder is closed may be varied over the switching sequence.

The time gaps between two successive switching points in a switching sequence may be given by $$\Delta t_n = \frac{1}{2\pi f_{LO}} \text{abs}\left(\text{acos}\left(1 - \text{abs}\left(\frac{2(n-N+1)}{N-1}\right)\right) - \text{acos}\left(1 - \text{abs}\left(\frac{2(n-N)}{N-1}\right)\right)\right)$$

for n=1 to 2N−2 where N is the total number of branches, $f_{LO}$ is the local oscillator frequency of the mixer. The above formula will generate the time gaps between switching to the next branch along the ladder following a sequence from one end of the ladder to the other and back. The starting phase of the waveform generated and therefore the generation of sine or cosine waveforms is determined by where along the ladder the sequence starts.

A combination of varying the time interval between switching over the switching sequence and "scaling" the resistors to generate a sinusoidal output is also envisaged. Also, the mixer may be configured to generate other output waveforms.

The mixer may include two output arrangements, a first output arrangement and a second output arrangement, the branches of the first and second output arrangements branching from the same points along the ladder, the first output arrangement having a first output where its branches convene and the second output arrangement having a second output where its branches convene, the mixer including a combiner configured to combine the first output and the second output.

The combiner may comprise a differential amplifier configured to receive the first output at a non-inverting terminal and the second output at an inverting terminal, an output of the differential output element based on a difference between signals of the first and second output.

This arrangement is advantageous as with an appropriate choice of switching sequence for the first and second sets, the output from the differential amplifier may have an output voltage twice that of the input voltage.

The combiner may include a phase shift element configured to apply a phase shift to the second output and then to combine the first output signal with the phase shifted second output signal. In this example, the switching sequence for the first and second sets may be the same.

The switches of the first output arrangement may be controlled with a first switching sequence and the switches of the second output arrangement may be controlled with a second switching sequence, which may be different to the first. The switching sequences may be phase shifted relative to one another. The phase shift may comprise approximately 90° or 180°.

The mixer may include four output arrangements, a first output arrangement, a second output arrangement, a third output arrangement and a fourth output arrangement, the branches of the four output arrangements branching from the same points along the ladder, the first output arrangement having a first output where its branches convene, the second output arrangement having a second output where its branches convene, the third output arrangement having a third output where its branches convene and the fourth output arrangement having a fourth output where its branches convene, the mixer including a combiner configured to combine the first output, the second output, the third output and the fourth output.

The combiner may include a differential output element configured to provide a first differential output comprising the difference between the first output and the second output, and a second differential output comprising the difference between the third output and the fourth output, the combiner including a phase shift element configured to phase shift the second differential output by substantially 90° relative to the first differential output, and combine the first differential output and the phase shifted second differential output.

The switching sequence applied to the first output arrangement may be 180° out of phase with the switching sequence applied to the second output arrangement. The switching sequence applied to the third output arrangement may be 180° out of phase with the switching sequence applied to the fourth output arrangement. Further, the switching sequence of the third and fourth output arrangements may be phase shifted by 90° relative to the switching sequence of the first and second output arrangements.

Said combiner may include an analogue to digital converter configured to convert the outputs from the ladder to digital signals and present a converted digital signal to the phase shift element for applying said phase shift to the digital signal. This is advantageous as it may be straightforward to introduce said phase shift in the digital domain.

These arrangements are advantageous as the mixer can be used as a harmonic reject mixer and/or a quadrature mixer.

The mixer described above may be used as part of a chopping amplifier. The mixer may comprise a modulator to modulate an input signal to a chopping frequency prior to amplification, the chopping amplifier including a demodulator configured to demodulate the amplified signal.

The demodulator may comprise a mixer as described in the first aspect of the invention.

According to a second aspect of the invention, we provide a signal generator including the mixer of the first aspect of the invention.

According to a third aspect of the invention, we provide a transmitter/receiver including the mixer of the first aspect of the invention.

BRIEF DESCRIPTION OF DRAWINGS

There now follows, by way of example only, a detailed description of embodiments of the invention with reference to the following figures, in which.

Figure 1:
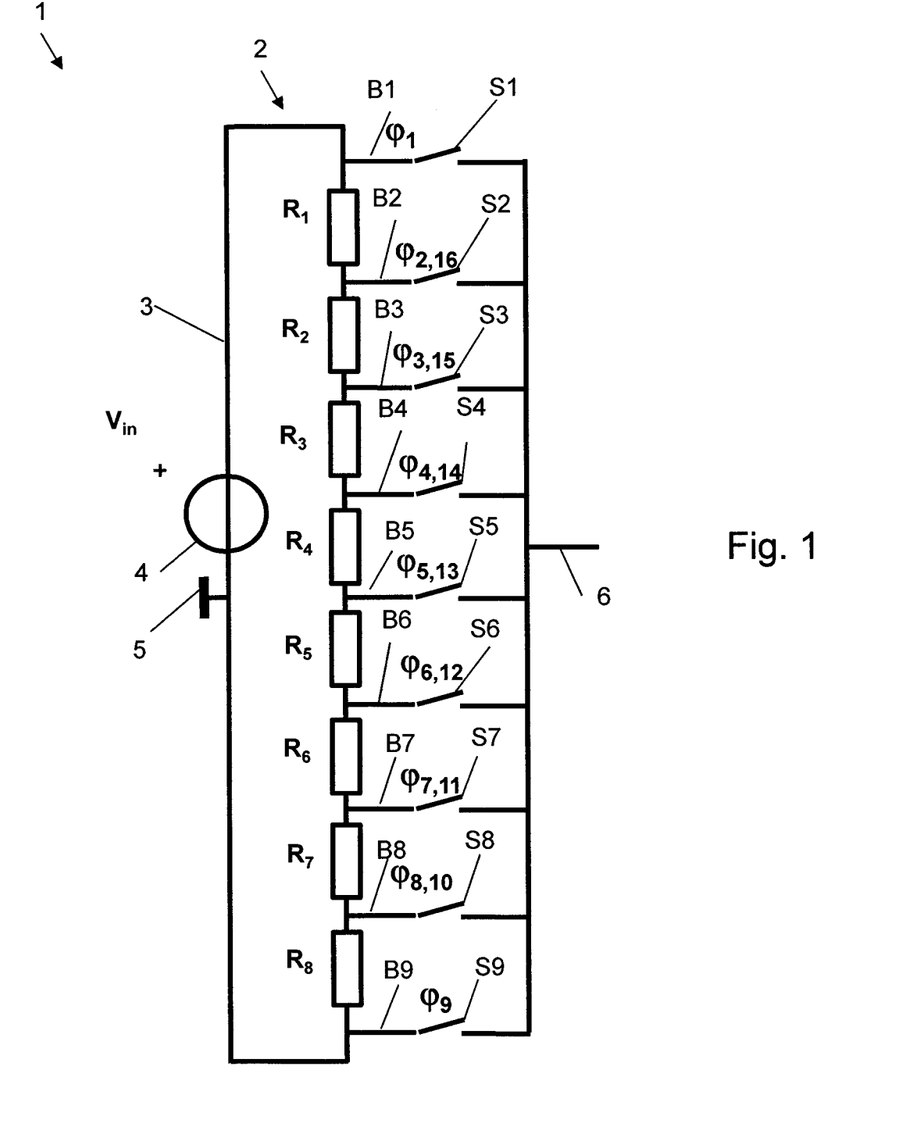
FIG. 1 shows a mixer structure according to a first embodiment.

FIG. 1 shows a mixer 1 comprising a ladder 2 comprising a plurality of discrete resistances R1-R8 in series. The ladder therefore comprises a chain link structure. Thus, the ladder 2 has an incrementally increasing resistance along its length as each resistor R1-R8 adds to the total resistance of the resistors before it in the chain. The ladder 2 has an input signal applied across it and includes an input 3 for receiving the input signal. In this embodiment, the input signal comprises a DC voltage, Vin, which is shown as a voltage source 4. The voltage source applies the input signal or DC voltage across the ladder 2, the ladder having the connection to the input 3 at one end and a connection to ground 5 at the other, opposite end. It will be appreciated that the input signal may take other forms.

In this embodiment, eight resistances R1 to R8 are provided. An output arrangement, which taps the resistor ladder at various points along it is provided. The output arrangement includes nine branches B1-B9. The branches extend from each end of the ladder and from between each of the resistances. It is an advantageous arrangement to provide N−1 discrete resistances and N branches as this provides the largest number of resistance levels from the ladder arrangement. Thus, the first branch B1 taps the input signal prior to any of the resistances of the ladder 2, and the other branches tap the input signal at different increments of resistance presented by each resistor in the ladder (plus those either side of it) up to the total resistance of the ladder.

A first branch B1 branches from the ladder 2 at position between the input 3 and a first resistance R1 in the ladder. A final branch B9 (i.e. the ninth branch) branches from the ladder 2 at a position between the ground 5 and a final resistance R8 in the ladder. The ladder 2 also includes a branch that branches from a point in between each of the discrete resistances. Thus, a branch B2 branches from between resistances R1 and R2. A branch B3 branches from between resistances R2 and R3. A branch B4 branches from between resistances R3 and R4. A branch B5 branches from between resistances R4 and R5. A branch B6 branches from between resistances R5 and R6. A branch B7 branches from between resistances R6 and R7. A branch B8 branches from between resistances R7 and R8.

Each of the branches B1-B9 are connected to a common output 6 and include a switch. The switch of each branch controls whether or not the ladder, at the point of the branch, is connected to the output 6. Accordingly, the switches control the resistance between the input 3 and the output 6, due to their different "resistance positions" on the ladder 2. Control of the switches can modify the amplitude of an input signal received at the input 3 and therefore by controlling the switches in a particular switching sequence, the input signal can be mixed with a mixer signal created by the switching sequence.

The first branch B1 includes a first switch S1, the second branch B2 includes a second switch S2 and so on until the ninth branch B9, which includes the ninth switch S9. The switches may be provided by transistors.

Figure 6:
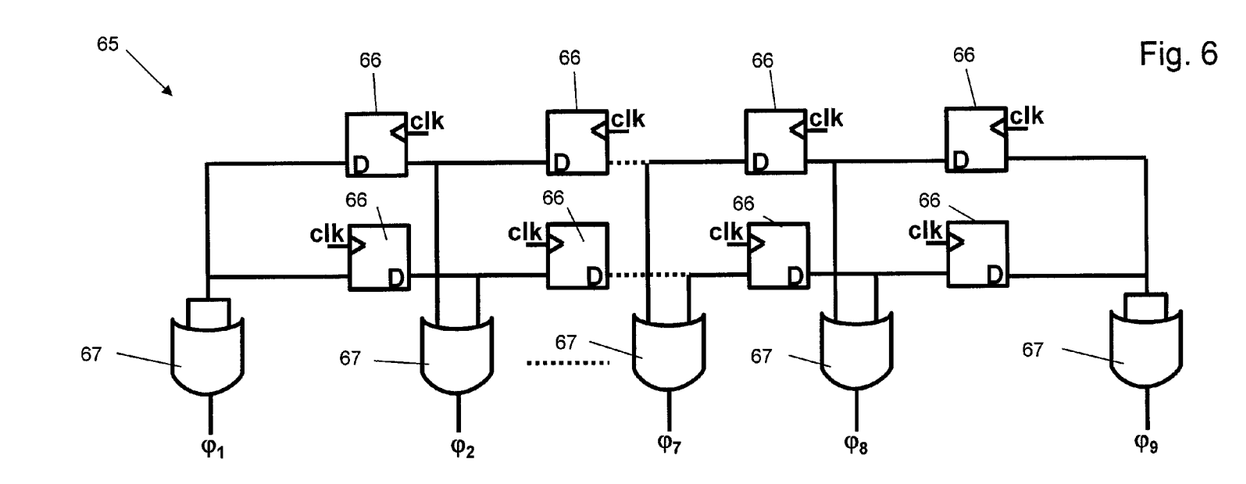
FIG. 6 shows an example structure for a switching controller.

The mixer 1 includes a switch controller (shown in FIG. 6 and as described below) which controls the switches S1-S9. The switch controller may comprise a ping-pong register as shown in FIG. 6, a microprocessor or any other type of state machine adapted to provide a switching signal.

In this embodiment, the mixer is configured to mix the input signal with a sinusoidal mixer signal. The sinusoidal mixer signal is provided in a step-wise manner by switching the switches in a particular order to present a varying resistance that causes the output signal to vary sinusoidally. It will be appreciated that the more branches and therefore discrete resistances, the finer the resolution of the mixer signal waveform applied to the input signal. The size of each of the resistances R1-R8 is selected such for a switching sequence with a constant interval between switching in which only one of the switches is closed at any one time and moving through the switches along the ladder in order and then back in reverse order, the resistance (of the ladder between the output and the input) oscillates between upper and lower limits to generate an output having a sinusoidal waveform of one wavelength.

Figure 2:
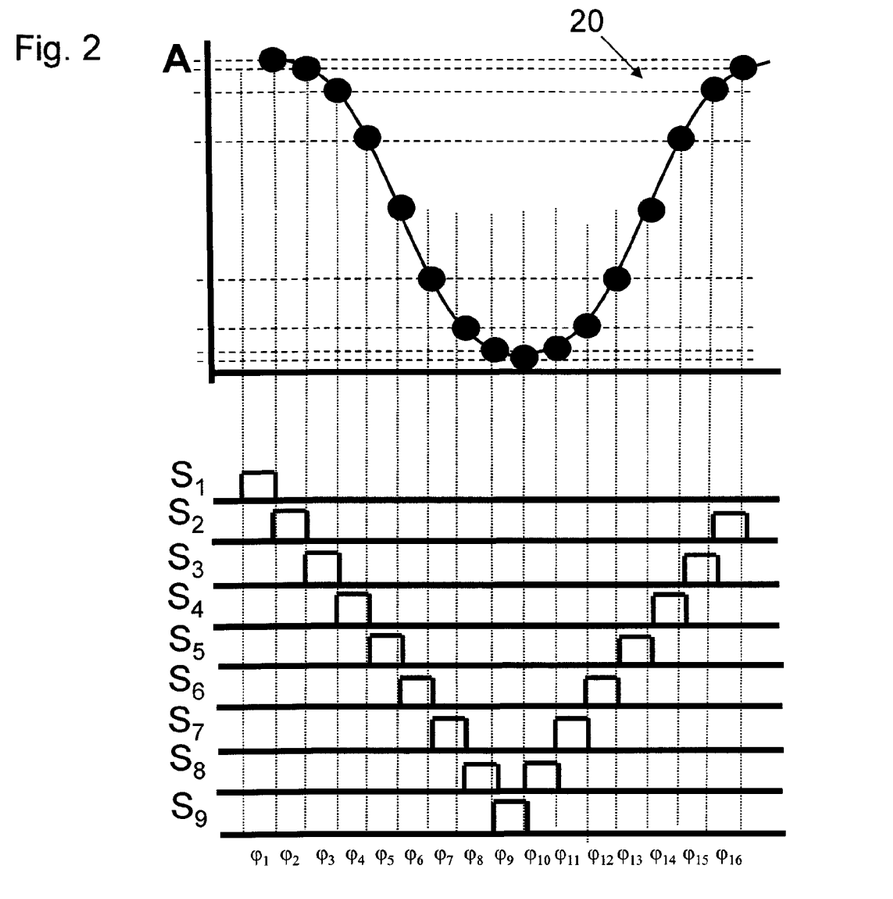
FIG. 2 shows a graph showing the voltage output of the mixer structure of FIG. 1 at each branch.

FIG. 2 shows, in the top half, the voltage at the output 6, following the switching sequence shown in the bottom half of the figure. The symbol φ is used to designate the periods of a switching sequence. The switching sequence is also shown in FIG. 1 adjacent the switch that is closed during that period. Thus, $\phi_1$ is the first switching period and, in this embodiment, switch S1 is closed with the remaining switches open. $\phi_2$ is the second switching period and switch S2 is closed with the remaining switches open and so on. The notation $\phi_{2,16}$ is used to show the switch that is closed during the second and sixteenth time period of the switching sequence. As shown in FIG. 1, switch S2 is controlled to be the closed switch during the second and sixteenth time period.

In order for the resistors R1 to R8 to present a sinusoidally varying waveform the resistance of each resistor $Rt_n$ is approximately given by;

$$Rt_n = Rt \cdot \sin\left(\frac{\pi}{2(N-1)}\right) \cdot \sin\left(\frac{\pi}{2(N-1)}(2n+1)\right)$$

for $n = [1 \ldots 8]$ where n is the nth resistor and N is the total number of output taps or branches in the output arrangement, and Rt is the total resistance of the ladder.

For example, in a ladder with N=9 branches, resistor R1, which is the first resistor in the ladder, n=1 out of a total of N−1=8 resistors, forming a ladder with total resistance of Rt=1 kOhm, the resistor values are given in the table below. It will be appreciated that this table shows an example arrangement and other arrangements and resistor values are envisaged.

| Resistor Number | Value of resistor |
| --- | --- |
| 1 | 38.0602 |
| 2 | 108.3864 |
| 3 | 162.2117 |
| 4 | 191.3417 |
| 5 | 191.3417 |
| 6 | 162.2117 |
| 7 | 108.3864 |
| 8 | 38.0602 |

The switch controller, in this example, is configured to switch the switches S1 to S9 in order and with a constant interval between switching (for a given mixer frequency), such that switch S1 is closed with all the remaining switches open, then switch S2 is closed with the remaining open until S9. Thus the switching sequence $\phi_1$ to $\phi_{16}$ comprises closing switches S1 through to S9 and then S8 through to S2. The sequence is therefore a "1 high" digital code closing one switch at a time. The first and last switches S1 and S9 in the ladder are closed once during the complete sequence while the other switches are closed twice in order to form a sinusoidal mixer waveform.

Figure 3:
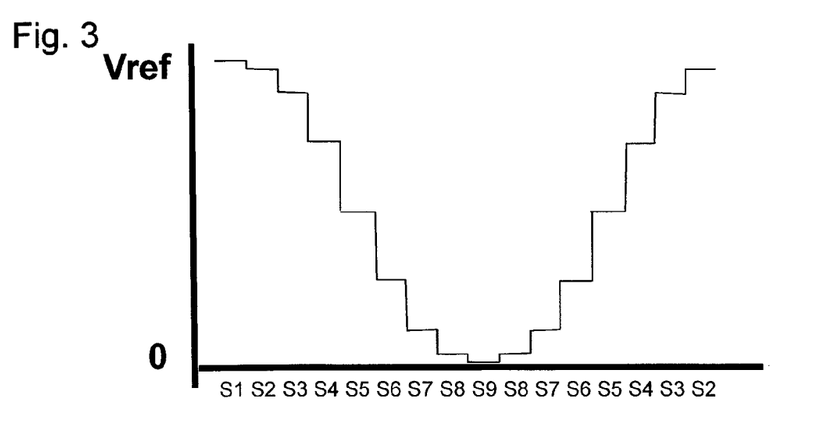
FIG. 3 shows an example waveform from the mixer structure of FIG. 1 with a DC input signal following a one switch closed switching sequence.

FIG. 3 shows the output waveform with a constant input signal of voltage Vref. The switch that is closed at each period is shown along the x axis and the voltage at the output 6 is shown on the y axis. The switching sequence starts with switch S1 and comprises S1-S2-S3-S4-S5-S6-S7-S8-S9-S8-S7-S6-S5-S4-S3-S2. Thus, the waveform of FIG. 3 shows that the ladder is capable of creating a step-wise approximation of a sine wave. Accordingly, the waveform has a frequency of $f_{LO}$ and a switching frequency of $f_s$ with $f_s/f_{LO}$ sample points.

Following the switching sequence, the output signal has the form ½$V_{in}$(1+sin($\omega_{LO}$t)) where $\omega_{LO}$=2π*$f_{LO}$ and t is the time period (frequency components related to fs have been left out for clarity). Ideally the output signal has no harmonic content related to $f_{LO}$. The waveform will have frequency components that correspond to $f_s$. However, these can be filtered out, as they can be at reasonably large distance compared to $f_{LO}$, depending on the oversampling fs/$f_{LO}$.

It will be appreciated that if the switching frequency $f_s$ is increased or decreased, the output signal frequency is also increased or decreased, this way the output frequency of the mixer can be controlled.

Figure 4A:
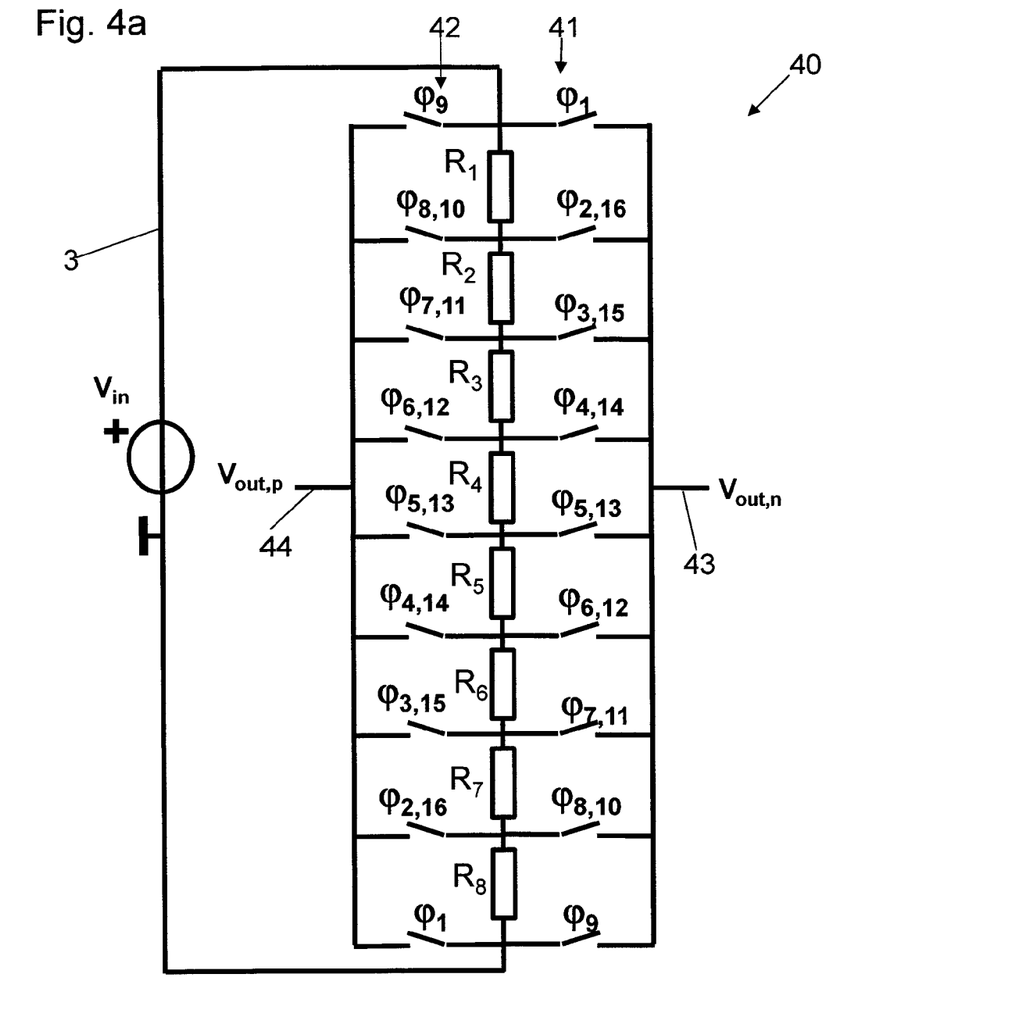
FIGS. 4a and 4b show a second embodiment of the mixer.
Figure 4B:
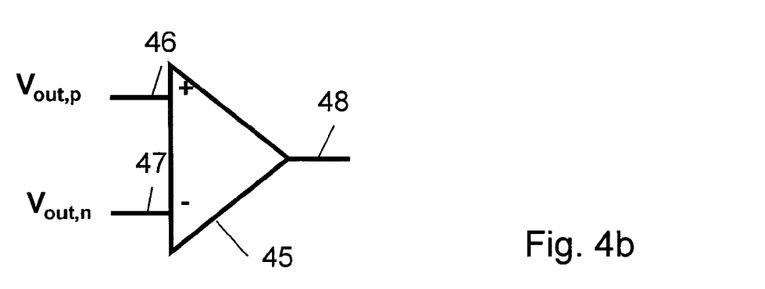

FIGS. 4a and 4b show a second embodiment of the mixer 40 split into two parts for clarity. Thus, the outputs from the ladder in FIG. 4a connect to the similarly labelled inputs in FIG. 4b.

This embodiment is substantially similar to the first embodiment except that two output arrangements from the ladder are provided. The first output arrangement 41 is arranged in a similar manner to that described in relation to FIG. 1. The second output arrangement 42 includes branches that branch from the resistor ladder at the same points as the first output arrangement 41. The first arrangement 41 connects to a first output 43 and the second arrangement connects to a second output 44. A switching controller (not shown) is also present which can selectively switch each of the switches in each of the arrangements as required. Thus, the two output arrangements may be independently controlled.

The mixer includes a differential output element 45 which may comprise a differential amplifier having a non-inverting input terminal 46 and an inverting input terminal 47. The first output 43 is configured to be connected to the non-inverting input terminal 46 and the second output 44 is configured to be connected to the inverting input terminal 47. The differential output element 45 forms an output 48 comprising a difference between the inputs to its terminals 46, 47.

FIG. 4a shows the order in which the switches in the two output arrangements are closed. As previously, the symbol φ denotes a time period over the switching sequence. φ1 representing the switches that are closed in a first time interval, φ2 the switches that are closed during the next, second time period and so on. Thus switch S1 of the first arrangement 41 and switch S9 of the second arrangement 42 are closed during time period φ1. During the next time interval φ2, switch S2 of the first arrangement 41 and switch S8 of the second arrangement 42 are closed and so on. After time period φ16, the sequence repeats. The switching sequence applied to the first output arrangement progresses in an opposite direction up and down the ladder relative to the switching sequence applied to the second output arrangement 42. The switching sequence of the two output arrangements results in the phase at output 43 being 180° shifted from the phase at output 44.

In the example of FIGS. 4a and 4b, the output signal 48 has the form $V_{in}$*sin($\omega_{LO}$t), effectively doubling the output voltage, compared to the single output structure of FIG. 1. It will be appreciated that the switch the switching sequence starts at determines the starting phase of the resultant waveform. Accordingly, the output signal has the form of $V_{in}$*sin($\omega_{LO}$t), which ignores the starting phase of the waveform. Thus, more generally, the output comprises $V_{in}$*sin($\omega_{LO}$t+p) where p comprises a starting phase angle of the waveform.

In the examples described above the input signal at the input 3 is a DC voltage. It will be appreciated that the input signal may comprise any form of signal. If, instead, the input signal comprises a sine wave with amplitude $V_{IN}$, the output signal would be: $V_{IN}$ sin($\omega_{ref}$t) sin($\omega_{LO}$t) where ω=2π*f and $\omega_{LO}$ represents the angular frequency of the waveform produced by the switching in the mixer and $\omega_{ref}$ designates the angular frequency of the waveform at the input 3. Further, the switching sequence can be altered to generate any desired mixer waveform.

The mixers described herein are advantageous as the mixing scales with $f_s$, as $f_{LO}$ is proportional to $f_s$. Furthermore, as the mixer only mixes with the fundamental of the local oscillator frequency ($f_{LO}$), the signals at multiples of $f_{LO}$ are not mixed back, giving the mixer perfect harmonic rejection.

Due to process tolerances, the resistor values may differ from their ideal values. This causes a shift in output voltages, which causes non-ideal output voltages that do not exactly describe the intended output signal, and therefore cause harmonic distortion of the output signal. The differential nature of the mixer of FIGS. 4a and 4b has the advantage that it does not output even order distortion of the signal that is generated, as the positive and negative signal halves of the first output 43 minus the second output 44 is always based on exactly the same ladder voltages. When used as a mixer, this gives perfect harmonic rejection at the even harmonics of $f_{LO}$, which is independent of process tolerances.

Using two of the mixers shown in FIGS. 4a and 4b with different starting phases provides the possibility of generating phase shifted signals such as quadrature signals (sine & cosine). Further, the mixer can be used as a quadrature mixer. Such an arrangement would allow an RF signal that is applied at the input of the mixer to be mixed with sine and cosine signals (depending on the switching phases applied), and mixed to an arbitrary output frequency or IF frequency.

Figure 5A:
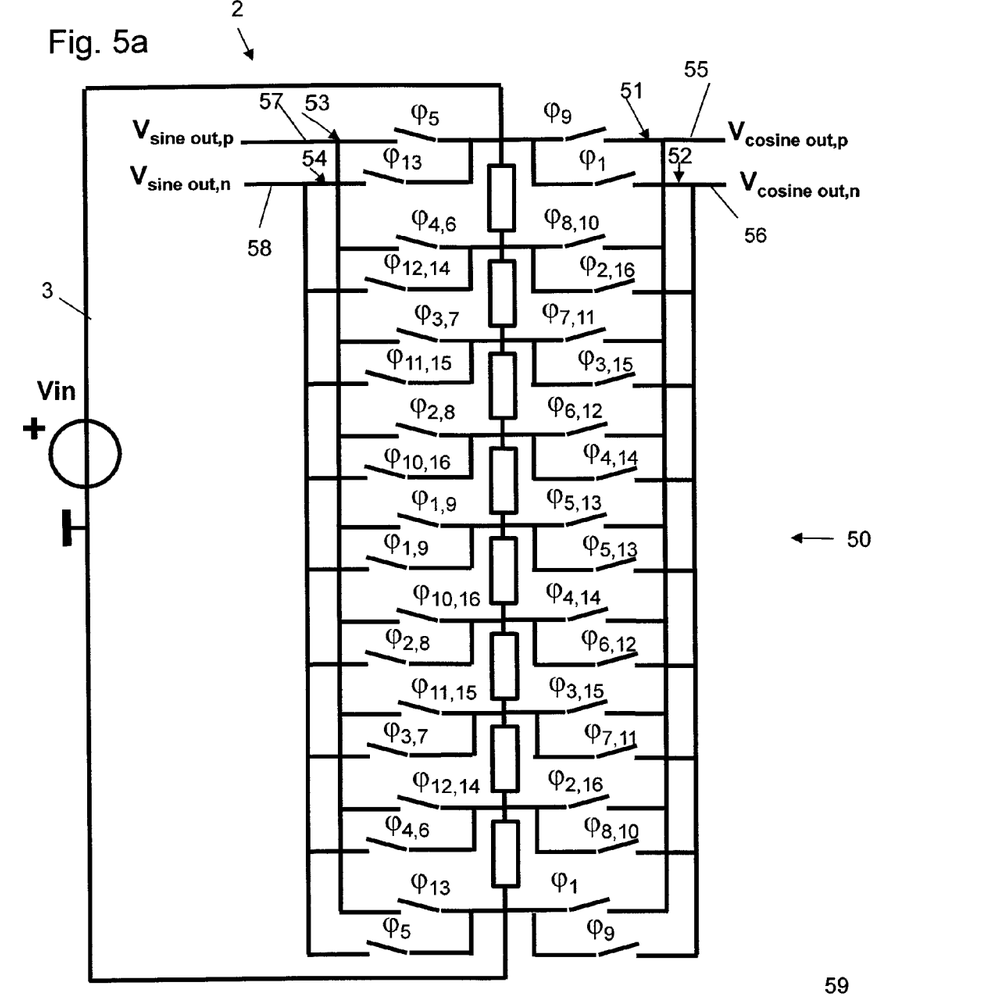
FIGS. 5a and 5b show a third embodiment of the mixer.
Figure 5B:
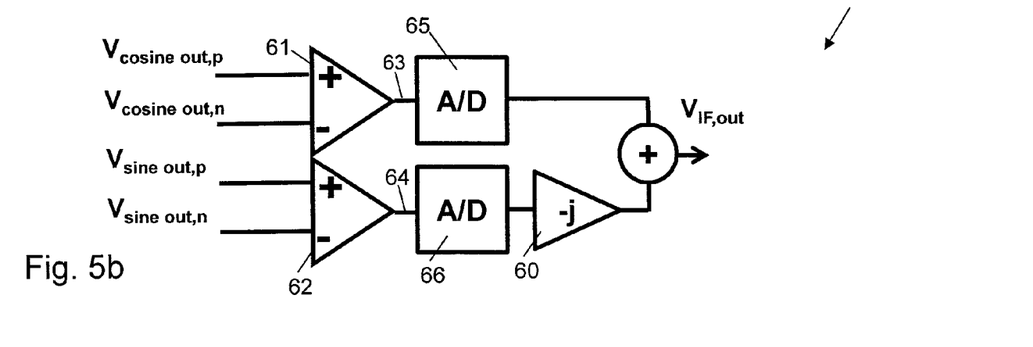

FIGS. 5a and 5b show an embodiment of such a structure 50. This embodiment is substantially similar to the first and second embodiments except that four output arrangements are provided for the ladder 2. The switches and branches of each output arrangement are numbered as in FIG. 1, S1-S9 for the switches and B1-B9 for the branches moving along the ladder from one end to the other (top to bottom, as shown in the Figures). The first output arrangement 51 is arranged in a similar manner to that described in relation to FIG. 1. The branches of the second output arrangement 52 branch from the resistor ladder at the same points as the first output arrangement 51. Likewise, the third output arrangement 53 and fourth output arrangement 54 also include branches that branch from the same points along the resistor ladder. The branches of the first output arrangement connect to a first output 55, labelled "Vcosine out, p"; the branches of the second output arrangement connect to a second output 56, labelled "Vcosine out, n"; the branches of the third output arrangement connect to a third output 57, labelled "Vsine out, p"; and the branches of the fourth output arrangement connect to a fourth output 58, labelled "Vsine out, n". A switching controller (not shown) is also present which can selectively switch each of the switches in each of the output arrangements as required. Each output arrangement may be associated with its own controller.

FIG. 5b shows a combiner 59 including a phase shift element 60. The combiner 59 includes two differential output elements 61 and 62. The first differential output element 61 forms an output 63 comprising the difference between the signals Vcosine out, p and Vcosine out, n. The first output 55 is received at the non-inverting terminal of the element 61 and the second output 56 is received at the inverting terminal of the element 61. The second differential output element 62 forms an output 64 comprising the difference between the output signal Vsine out, p and Vsine out, n. The third output 57 is received at the non-inverting terminal of the second element 62 and the fourth output 58 is received at the inverting terminal of the second element 62.

The combiner 59 also includes analogue to digital (AD) converters 61, 62. The first A/D converter 61 converts the differential output 63 to a digital signal. The second A/D converter 62 converts the differential output 64 to a digital signal. The digital differential output 64 is received by the phase shift element 60, which introduces a 90° phase shift. The differential output 63 and the phase shifted differential output 64 is then combined to form an output, $V_{IF, out}$ of the mixer 50.

It will be appreciated that the phase shift element 60 may be configured to introduce a phase shift in the analogue domain rather than in the digital domain. Accordingly, the A/D converters may not be required.

The switching sequence for the first output arrangement comprises following a "one closed" switching sequence S1 to S9, S8 to S2 to form Vcosine out, p. The switching sequence for Vcosine, n is 180° out of phase with Vcosine out, p and sequentially moves through the switches S9 to S1, then S2 to S8. The sequence for Vsine out, p is 180° out of phase with the sequence for Vsine out, n. The sequence for Vsine out, p is phase shifted by 90° relative to Vcosine out, p. Thus, the sequence for the third output arrangement to generate Vsine out p comprises closing switches S5 to S1, S2 to S9, then S8 to S6. The sequence for the fourth output arrangement to generate Vsine out n comprises closing switches S5 to S9, S8 to S1, then S2 to S4.

Thus, the switching sequence for the first output arrangement 51 is designated seqCosP, the switching sequence for the second output arrangement 52 is designated seqCosN, the switching sequence for the third output arrangement 53 is designated seqSinP and the switching sequence for the fourth output arrangement 54 is designated seqSinN. The numbers in the square brackets represent the switch number of that particular output arrangement that is closed over the switching sequence.

seqCosP=[1 2 3 4 5 6 7 8 9 8 7 6 5 4 3 2 1];
seqCosN=[9 8 7 6 5 4 3 2 1 2 3 4 5 6 7 8 9];
seqSinP=[5 4 3 2 1 2 3 4 5 6 7 8 9 8 7 6 5];
seqSinN=[5 6 7 8 9 8 7 6 5 4 3 2 1 2 3 4 5].

The switching periods $\phi_1$ to $\phi_{16}$ are shown in FIG. 5a adjacent the switch that is closed during the named time period.

Thus, an input signal $V_{RF}$, may be have the form $$V_{RF}=e^{j\omega_{RF}t}$$

Thus, the output signal, $V_{IF,out}$ may be given by;

$$V_{IF,out}=V_{RF}(\cos(\omega_{LO}t)-j\sin(\omega_{LO}t))$$

It will be appreciated that $f_{RF}-f_{LO}=f_{IF}$ which leads to:

$$V_{IF,out}=e^{j(\omega_{RF}-\omega_{LO})t}=e^{j\omega_{IF}t}$$

Thus, as the sine and cosine outputs (Vcosine out, p, Vcosine out, n, Vsine out, p and Vsine out, n) are obtained from the same ladder, their signal amplitude will exactly match (the sine and cosine amplitudes will be exactly the same), and their phase shift is very well defined, therefore giving substantially perfect image rejection.

The mixer of the invention may solve the problem of parasitic mixing. A known problem in passive RF mixers (such as in a passive mixer comprising four CMOS switches) is harmonic down modulation of unwanted signals. When using a square wave to drive the mixer, un-intended mixing of the harmonics of the local oscillator (LO) frequency with the input RF signal leads to the mixing of unwanted signals back to baseband, distorting the signal to be down converted (eg. a radio channel). This problem is currently solved by either using sufficient analogue filtering before mixing, which is costly, or by using a harmonic reject mixer, which is fairly difficult to design. The mixer of the present invention, which ideally does not have harmonics related to $f_{LO}$, substantially obviates this parasitic mixing problem.

The switching sequence (represented by $\phi_x$), can be generated by any kind of microprocessor or state machine. FIG. 6 shows an arrangement in which the switching signals are generated with a ping-pong register 65. The register comprises a plurality of flip-flops 66 arranged in a ring. Each flip-flop includes an output D and an input clock signal from a common clock. The flip-flops 66 are arranged in pairs and the pairs provide their output D to an associated OR gate 67. Each OR gate 67 controls one of the switches S1-S9. The switches at the ends of the ladder S1 and S9 also receive a switching signal from one of the OR gates 67, but those OR gates are actuated by a single flip-flop 66 rather than a pair of flip flops 66. This is because, the switches S1, S9 at the ends of the ladder are only actuated once per full wavelength sinusoidal output while the intermediate switches S2-S8 are actuated twice. Thus, two flip-flops 66 are provided to actuate the associated intermediate switch at the two times required during the switching sequence $\phi 1$ to $\phi 16$. It will be appreciated that other sequences are possible and all of the switches may be activated twice per switching sequence or any other number of times depending on the structure of the ladder, the resistances therein and the intended output waveform.

Thus, at power up, one of the flip-flops is set to provide an output signal, while all the others are reset (and do not provide an output signal). The single flip-flop that is set in the register 65 determines the starting phase of the mixer (or more particularly the starting phase of the output arrangement the particular register is associated with). At each clock cycle supplied to "clk" of each flip-flop (at the switching frequency $f_s$) the output (digital "1") is shifted to the next flip-flop in the ring. Thus, with successive clock signals, the flip-flops 66 provide an output signal that shifts around the ring of flip-flops.

A flip flop register 65 may be provided for each output arrangement of switches as described in relation to FIGS. 4a, 4b and 5a, 5b.

It will be noted that although the above-mentioned ladder 2 comprises a range of resistances to modify the amplitude of an input signal, the resistor ladder can be replaced by a similar embodiment implemented with scaled current sources or capacitors, or resistors that are switched in parallel. Further, in the above described embodiments, the mixer includes resistances that are scaled such that with a fixed switching period (for a given mixer frequency), the resistance of the ladder varies sinusoidally. Alternatively, the resistances (or capacitors, current sources) may be the same, but the controller may use a non-equidistant time steps between switching, which leads to non-uniform sized time periods, such that the resistance of the ladder is applied to the input signal at the appropriate time to form an approximated sinusoidal waveform. Of course a combination of non-uniform distributed resistances and non-equidistant time steps is possible. A further modification may be to how the input signal is applied across the ladder in FIG. 5a. The input signal may comprise a differential input signal. In particular, an input signal may be applied at one end of the ladder and an anti-phase of the input signal may be applied at the other, opposite end of the ladder. The input signal can be of any form and the switching sequence and resistor values/switching time intervals can be altered to provide the desired output waveform.

Another application of the mixer described herein is to provide an alternative means for offset reduction techniques like chopping. In known chopping amplifiers a four switch mixer is used in front of an amplifier to move an input signal to a chopping frequency $f_{chop}$. At the output of the amplifier a demodulator, which may also comprise a four switch mixer, is present, to demodulate the input amplified signal back to baseband. At the output of the amplifier the amplifier offset is modulated to the chopping frequency by the demodulator, where it can be filtered. This way, the input signal can be separated from the amplifier DC offset. A possible problem with this chopping technique is that due to the limited amplifier bandwidth, filtering of the higher order harmonics of the chopping frequency will cause errors in the demodulated signal.

The mixer topology proposed herein overcomes these drawbacks and can replace the four switch mixer used as a modulator before the amplifier in prior art chopping amplifiers. In the proposed mixer the input signal is only mixed to $f_{chop}$, and, by virtue of the mixer arrangement, does not output the higher order harmonics of the chopping frequency $f_{chop}$, which would be present when using a known chopping amplifier having a 4-switch mixer. Applying the new mixer topology as a chopper, the bandwidth limitation in the amplifier is actually advantageous as it will filter the signal components related to $f_s$. The output demodulator may still comprise a known four switch mixer, as at the harmonic frequencies of the square wave driving switches, ideally, there is no signal content.

Figure 7:
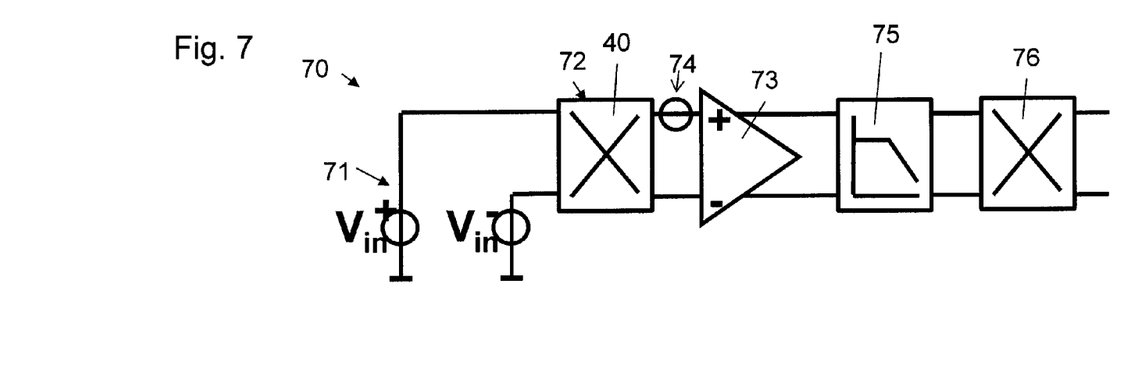
FIG. 7 shows a chopping amplifier incorporating the mixer structure of FIGS. 1, 4a and 4b or 5a and 5b.

FIG. 7 shows a chopping amplifier 70 having an input 71 for receiving an input signal $V_{in}$+ and $V_{in}$-. A mixer 72, which comprises the mixer 40, is provided to act as a modulator and mix the input signal with a signal having frequency $f_{chop}$. The input signal $V_{in}$+ is applied to one end of the ladder 2 and the input signal $V_{in}$- is applied to the other end of the ladder. The output from the ladder 2 is amplified by a differential amplifier 73. Element 74 represents an offset caused by the amplifier. Element 75 represents the limited bandwidth of the amplifier or a filter for filtering unwanted high frequency signals. Demodulator 76, which comprises the mixer of the invention 40 or a known four switch mixer, is provided to demodulate the amplified signal back to baseband.

The invention claimed is:

1. A mixer circuit comprising
   a ladder having at least two resistances arranged in series and
   an input configured to receive an input signal and apply it across the ladder,
   said ladder including
      an output arrangement comprising at least three branches,
      a first branch branching from a first end of the ladder,
      a second branch branching from between the at least two resistances and
      a third branch branching from a second end of the ladder, opposite the first end,
      each branch including a switch for controlling a connection between its branch and an output;
   wherein the branches are coupled to a common output;
   wherein the mixer includes a switch controller configured to switch said switches at a switching frequency ($f_s$) resulting in a waveform frequency ($f_{LO}$) on the common output.

2. A mixer according to claim 1,
   in which
      the ladder comprises N-1 discrete resistances and
      the output arrangement comprises N branches
   wherein
      a first branch branches from the ladder at the first end,
      a final branch branches from the ladder at the second end and
      the other branches branch from positions between adjacent resistors in the ladder.

3. A mixer according to claim 1,
   in which the switch controller may be configured to close one of the switches at a plurality of successive switching times of the switching sequence, while setting the remaining switches to be open.

4. A mixer according to claim 1,
   in which the switching sequence comprises
      closing one of the switches at each of a plurality of successive switching times of the switching sequence and
      closing the switches in an order as they are arranged in the ladder from one end of the ladder to an opposite end and back.

5. A mixer according to claim 4,
   in which the interval between switching times is constant.

6. A mixer according to claim 1,
   in which the resistance of each resistor $Rt_n$ in the ladder is given by;

$$Rt_n = Rt \cdot \sin\left(\frac{\pi}{2(N-1)}\right) \cdot \sin\left(\frac{\pi}{2(N-1)}(2n+1)\right)$$

where n is the nth resistor and N is the total number of branches in the output arrangement, and Rt is the total resistance of the ladder.

7. A mixer according to claim 1,
   in which the resistors in the ladder have the same resistance and the interval between switching times over the switching sequence is varied.

8. A mixer according to claim 1,
   in which the mixer includes two output arrangements, a first output arrangement and a second output arrangement,
      the branches of the first and second output arrangements branching from the same points along the ladder,
      the first output arrangement having a first output where its branches convene and
      the second output arrangement having a second output where its branches convene.

9. A mixer according to claim 8,
   in which the mixer including a combiner configured to combine the first output and the second output, the combiner comprising
      a differential amplifier configured to receive the first output at a non-inverting terminal and the second output at an inverting terminal,
      an output of the differential output element based on a difference between signals of the first and second output.

10. A mixer according to claim 1, in which
    the mixer includes two output arrangements, a first output arrangement and a second output arrangement,
    the switches of the first output arrangement are controlled with a first switching sequence and
    the switches of the second output arrangement are controlled with a second switching sequence,
    wherein the first and second switching sequence are 90° or 180° out of phase.

11. A mixer according to claim 1,
in which the mixer includes four output arrangements, a first output arrangement, a second output arrangement, a third output arrangement and a fourth output arrangement,
the branches of the four output arrangements branching from the same points along the ladder,
the first output arrangement having a first output where its branches convene,
the second output arrangement having a second output where its branches convene,
the third output arrangement having a third output where its branches convene and
the fourth output arrangement having a fourth output where its branches convene,
the mixer including a combiner configured to combine the first output, the second output, the third output and the fourth output.

12. A mixer according to claim 11, in which
the switching sequence applied to the first output arrangement is 180° out of phase with the switching sequence applied to the second output arrangement;
the switching sequence applied to the third output arrangement is 180° out of phase with the switching sequence applied to the fourth output arrangement; and
the switching sequence of the third and fourth output arrangements may be phase shifted by 90° relative to the switching sequence of the first and second output arrangements.

13. A chopping amplifier including the mixer of claim 1,
wherein the waveform frequency ($f_{LO}$) on the common output is set to a chopping frequency;
the chopping amplifier including an amplifier configured to amplify the chopping frequency,
the chopping amplifier including a demodulator configured to demodulate the amplified signal.

14. A transmitter/receiver including the mixer of claim 1.

* * * * *